US007466257B2

(12) United States Patent
Akizuki et al.

(10) Patent No.: US 7,466,257 B2
(45) Date of Patent: Dec. 16, 2008

(54) DELTA-SIGMA AD CONVERTER

(75) Inventors: Taiji Akizuki, Miyagi (JP); Tomoaki Maeda, Hiroshima (JP); Hisashi Adachi, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 11/898,645

(22) Filed: Sep. 13, 2007

(65) Prior Publication Data

US 2008/0074302 A1 Mar. 27, 2008

(30) Foreign Application Priority Data

Sep. 13, 2006 (JP) ............................ 2006-248365

(51) Int. Cl.
*H03M 3/00* (2006.01)

(52) U.S. Cl. ...................................... 341/143; 341/155

(58) Field of Classification Search ................. 341/143, 341/144, 155, 141
See application file for complete search history.

(56) References Cited

U.S. PATENT DOCUMENTS 5,659,314 A * 8/1997 Tokura et al. ............... 341/143
5,896,101 A * 4/1999 Melanson ................... 341/143
6,087,969 A * 7/2000 Stockstad et al. ........... 341/143

FOREIGN PATENT DOCUMENTS

JP 2005-72632 A 3/2005

OTHER PUBLICATIONS

Koh, et al., "A 66dB DR 1.2V 1.2mW Single-Amplifier Double-Sampling 2nd-order ΔΣ ADC for WCDMA in 90nm CMOS," ISSCC 2005, Session 9, Switched-Capacitor ΔΣ Modulators, IEEE International Solid-State Circuits Conference.

* cited by examiner

*Primary Examiner*—Brian Young
(74) *Attorney, Agent, or Firm*—McDermott Will & Emery LLP

(57) ABSTRACT

The output of a first integrator is quantized in a quantizer. The quantized signal is subjected to D/A conversion, successively output to a plurality of output paths by a first switching circuit, sampled and held by a plurality of charge-holding circuits of a first feedback circuit, and successively output by a second switching circuit to one of the input terminals of a subtractor. On the other hand, the output signal of the first integrator is successively output by a third switching circuit to a plurality of output paths, sampled and held by a plurality of charge-holding circuits of a second feedback circuit, and successively input to the other input terminal of the subtractor by a fourth switching circuit along with signals held in an input portion, which samples and holds input analog signals. By doing so, a plurality of signals with different sampling timings are integrated accumulatively by the subtractor and the first integrator. When integration functions used to obtain an n-th order noise-shaping effect are multiplexed and operated using a single integrator, the integrator's current consumption can be suppressed.

9 Claims, 13 Drawing Sheets

DELTA-SIGMA AD CONVERTER

BACKGROUND OF THE INVENTION

1. Field of the Invention

The present invention relates to a Delta-Sigma AD converter that is utilized, e.g. in radio receivers requiring high-speed clock operation and a high SNR (Signal to Noise Ratio).

2. Description of Related Art

Conversion of analog signals into digital signals makes easy and efficient signal transmission and processing possible. Accordingly, analog-to-digital (AD) converters are an important feature in radio receivers used in mobile phones etc. As a result of the increased data speeds associated with the increase in the broadband capabilities of communication systems in recent years, there is a need to simultaneously implement low power consumption, high-speed clock operation, and high SNRs in AD converters. For this reason, efforts have continued to be made in order to increase the operating clock speed in Delta-Sigma AD converters, which were originally used in measuring equipment and which make it possible to easily achieve a high SNR.

FIG. 13 is a block diagram showing an example of a conventional n-th order Delta-Sigma AD converter (see FIG. 1 of JP2005-72632A). This n-th order Delta-Sigma AD converter is composed of integrators 30[0]-30[*n*], subtractors 31[0]-31[*n*], input circuits 32[0]-32[*n*], feedback circuits 33[0]-33[*n*], a quantizer 34, and a digital-to-analog converter 35. It has a closed loop configuration, in which the digital output of the quantizer 34 is converted to an analog quantity by the digital-to-analog converter 35 and fed to the subtractors 31[0]-31[*n*] via the feedback circuits 33[0]-33[*n*]. A difference between the output signals of the input circuits 32[0]-32[*n*] and the output signals of the feedback circuits 33[0]-33[*n*] is obtained by the subtractors 31[0]-31[*n*] and their output signals are input, respectively, to the integrators 30[0]-30[*n]*.

The integrators 30[0]-30[*n*] possess low-pass filter characteristics, whereby they pass only low-frequency components and block high-frequency components. For this reason, when the above-described AD converter configuration is used, the action of the analog integrators 30[0]-30[*n*] on the quantization noise generated by the quantizer 34, which is a type of white noise independent of the frequency characteristic, causes low-frequency noise power to shift towards higher frequencies and reduces noise power in the signal frequency band. This effect is generally known as the "noise-shaping effect".

Here, in a first-order integrator, the amount of attenuation of noise power at low frequencies reflects a first-order noise shaping effect (20 dB/dec) and, in an n-th order integrator, it reflects an n-th order noise shaping effect (n×20 dB/dec). Therefore, in terms of implementing a high SNR, it becomes advantageous to increase the number of integrators and increase the filter order.

However, increasing the number of integrators leads to increased power consumption and, in case of portable radios, creates problems in practical use.

To eliminate such problems, a method has been proposed, in which integrators are multiplexed and a filter characteristic equivalent to n integrators is attained in a single integrator (e.g. see ISSCC 2005, Session 9/9.3, "A 66 dB DR 1.2V 1.2 mW Single-Amplifier Double-Sampling 2nd-order ΔΣ ADC for WCDMA in 90 nm CMOS").

FIG. 14 is a block diagram schematically illustrating a sigma-delta AD converter obtained when 2nd-order integrators are multiplexed. In the configuration of FIG. 14, a signal from an input circuit 32 is input to a subtractor 31 and, along with that, two outputs from an integrator 30, one that is 1 sample behind (unit delay) and another one from a sampling instant, are fed back by a feedback circuit 36 to the subtractor 31 at the input of the integrator 30. Furthermore, outputs from a digital-to-analog converter 35, one that is 1 sample behind (unit delay) and another one from a sampling instant, are fed back by feedback means 37 to the subtractor 31 at the input of the integrator 30. As a result, a low-pass filter characteristic equivalent to a configuration with two integrators is provided without multiplexing the integrator 30. Other configurations are similar to the conventional example of FIG. 13.

Furthermore, the feedback circuit 36 is configured to have n integrator outputs ranging from n samples behind (n-sample delay) to the sampling instant, the feedback circuit 37 is configured to have n digital-to-analog converter outputs from n samples behind (n-sample delay) to the sampling instant, and, in a similar manner, the outputs can be fed back to the subtractor 31 at the input of the integrator. As a result, it becomes possible to provide a low-pass filter characteristic equivalent to a configuration with n integrators, improve integrator power consumption, and achieve a high SNR based on an n-th order noise-shaping effect.

However, to obtain an n-th order noise-shaping effect in the conventional multiplexing circuit system shown in FIG. 14, it is necessary to use a configuration, in which the n feedback circuits constituting the feedback circuit 36 are connected in parallel to the I/O terminals of the integrator 30 and the n feedback circuits constituting the feedback circuit 37 are connected in parallel to the input of the integrator 30, and, furthermore, to operate the circuitry of all the feedback circuits 36 and 37 during each sampling time interval. Accordingly, the load connected to the I/O of the integrator 30 increases in comparison with the case shown in FIG. 13, in which integrators are not multiplexed.

Generally speaking, in an integrator, its characteristics, in particular its settling time and stability, will deteriorate if the current consumption of the integrator is not increased in proportion to an increased load. For this reason, the problem is that when n integrators are multiplexed and operated using a single integrator in a configuration such as the one shown in FIG. 14, the current consumption of the single integrator is increased and the current consumption-reducing effects resulting from integrator multiplexing are decreased.

SUMMARY OF THE INVENTION

Therefore, it is an object of the present invention to provide a Delta-Sigma AD converter, in which the increase in the integrator current consumption can be suppressed when integration functions are multiplexed so as to be operated using a single integrator in order to produce a n-th order noise-shaping effect.

In order to solve the above-described problems, the Delta-Sigma AD converter of the present invention comprises: a subtractor outputting a difference of two analog input signals; a first integrator integrating the output of the subtractor; a quantizer quantizing the output signal of the first integrator; a digital-to-analog converter outputting an analog signal in proportion to the output signal of the quantizer; a first switching circuit that, for each predetermined sampling timing, switches the output signal of the digital-to-analog converter and successively outputs the output signal to different output paths; a first feedback circuit having multiple charge-holding circuits respectively connected to different output paths from the first switching circuit, with the charge-holding circuits holding respectively differing amounts of feedback of a signal in proportion to the magnitude of the output signal of the digital-to-analog converter during predetermined sampling time intervals; a second switching circuit that, for each sampling timing, switches the signal held in the first feedback circuit and outputs the signal to one of the input terminals of the subtractor, an input portion that, for each predetermined sampling timing, holds a signal in proportion to the analog input signal during a fixed sampling time interval; a third switching circuit that, for each predetermined sampling timing, switches the output signal of the first integrator and successively outputs the output signal to different output paths; a second feedback circuit having multiple charge-holding circuits respectively connected to different output paths from the third switching circuit, with the charge-holding circuits holding differing amounts of feedback of a signal in proportion to the magnitude of the output signal of the first integrator input from the third switching circuit during predetermined sampling time intervals; and a fourth switching circuit that, for each sampling timing, switches signals held in the input portion and signals held in the second feedback circuit and inputs the signals to the other input terminal of the subtractor. The plurality of signals of different sampling timings held in the first and second feedback circuits are integrated accumulatively in the subtracter and first integrator.

According to the above-described configuration of the present invention, because the third switching circuit is placed between the output terminal of the first integrator and the second feedback circuit, each of the charge-holding circuits of the second feedback circuit is connected to the output of the first integrator only when connected selectively by the third switching circuit for each sampling timing, thereby making it possible to lighten the load at the output terminal of the first integrator.

Moreover, because the second switching circuit is placed between the input terminal of the first integrator and the first feedback circuit and the fourth switching circuit is placed between the input terminal of the first integrator and the second feedback circuit, switching the second and fourth switching circuits for each sampling timing makes it possible to connect only one of the charge-holding circuits selectively by the second and fourth switching circuits to the input terminal of the first integrator, so as to lighten the load at the input terminal of the first integrator.

Accordingly, even when integration functions are multiplexed in order to implement an n-th order filter characteristic necessary to produce an n-th order noise-shaping effect with a single integrator, the increased load on the single integrator can be lightened, and the increase in the current consumption needed to satisfy requirements imposed on the settling time and other characteristics of the integrator can be suppressed while being able to obtain an n-th order noise-shaping effect.

BRIEF DESCRIPTION OF THE DRAWINGS

FIG. 6Ab is a diagram illustrating the quantization noise filter characteristic of the Delta-Sigma AD converter of Embodiment 1 using a frequency characteristic.

FIG. 6Bb is a diagram illustrating the quantization noise filter characteristic of the Delta-Sigma AD converter of Embodiment 2 using a frequency characteristic.

DETAILED DESCRIPTION OF THE INVENTION

Based on the above-described configuration, the Delta-Sigma AD converter of the present invention can assume the following various embodiments.

For instance, it is preferable to provide a second integrator that is inserted between the input portion and the fourth switching circuit and that integrates signals held in the input portion and inputs them to the input terminal of the fourth switching circuit.

In accordance with this configuration, limiting the I/O gain and integrating signals in proportion to the analog input signals requiring an increased current consumption in the second integrator makes it possible to simplify the controller and achieve stabilization of closed loop characteristics in an integrator configured with both a first and a second feedback circuit. The reasons for this are explained below.

For instance, when an n-th order filter characteristic is configured using n integrators, the pass gain of the n-th order filter is usually increased in order to achieve a high SNR, as a result of which the stability of the closed loop characteristics has to be ensured by attenuating the gain in the integrator of the initial stage. In other words, in comparison with other integrators, the I/O gain has to be limited only in the initial-stage integrator.

Figure 15:
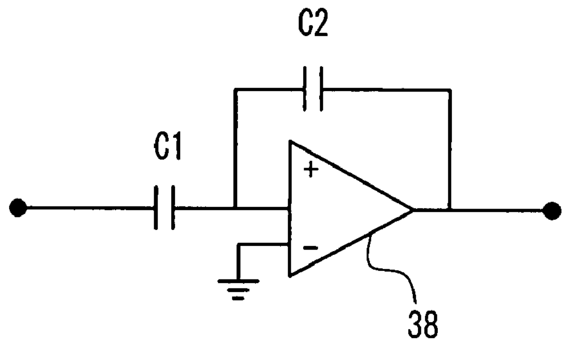
FIG. 15 is a block diagram illustrating I/O gain.

For instance, as shown in FIG. 15, when an integrator is configured with an operational amplifier 38, an input capacitor C1 connected to the input terminal of the operational amplifier 38, and an integration capacitor C2, which shorts the I/O terminals, the I/O gain of the operational amplifier 38 can be expressed in terms of capacitance ratios as "C1/C2 times". In other words, in comparison with other integrators, only the initial-stage integrator utilizes a large integration capacitor C2 when configuring the filter. Namely, the load connected to the I/O terminals increases only in the initial-stage integrator, resulting in the need to also increase the current consumption to satisfy requirements imposed on the characteristics of the integrator.

On the other hand, when an n-th order filter characteristic is configured using a single integrator, as in the present invention, switching control means are required that, in comparison with other sampling time intervals, preferentially limit the I/O gain of the first integrator and at the same time increase the current consumption in order to satisfy the characteristics of the first integrator in the sampling time interval, during which the input portion holding signals in proportion to the analog input signals is connected by the fourth switching circuit to the first integrator. When such switching control means are added, instantaneous operating characteristics change, which makes it difficult to ensure the stability of the closed loop characteristics.

By contrast, according to the configuration utilizing the second integrator as described above, by limiting the I/O gain and integrating signals in proportion to the analog input signals requiring an increased current consumption in the second integrator it is made possible to simplify the switching control means and achieve stabilization of the closed loop characteristics.

In addition, while it is necessary to continuously operate the integrators when using double-sampling, which involves operating the circuitry during each half-period of the sampling time interval, in this configuration, degradation in integrator characteristics, such as settling time, etc., can be reduced because no time is needed to switch the current consumption and I/O gain of the integrators during each sampling time interval.

Moreover, in the Delta-Sigma AD converter of the above-described configuration of the present invention, the input portion and second integrator may be controlled using a sampling timing configured with a clock duty ratio different from the predetermined sampling time intervals in the first and second feedback circuits.

In accordance with this configuration, a longer sampling time interval, during which the second integrator is connected to the input portion, can be set up by modifying the clock duty ratio controlling the input portion and second integrator without changing the sampling time interval, during which the fourth switching circuit is connected to the output terminal of the second integrator. Generally speaking, because insufficient settling of the initial-stage integrator with an n-th order filter characteristic is the primary factor in SNR degradation due to insufficient settling time, this configuration, by making the sampling time interval longer in the initial-stage integrator, remedies the lack of settling time and can reduce SNR degradation. Moreover, the current consumption of the second integrator can be reduced because it is possible to make the settling time longer without incurring SNR degradation.

In the above-described configuration, the first and second feedback circuits preferably may be composed of switched capacitors. In accordance with this configuration, the switching circuits of the switched capacitor circuit and the switching circuits connected to the I/O terminals of the feedback circuits can be shared, thereby simplifying the circuitry.

Moreover, the first integrator can be formed using two integrators and a single feedback circuit. Because this configuration creates a resonant circuit structure, in which signals from the output terminals of two integrators return to the input terminals via a feedback circuit, quantization noise can be further attenuated based on a noise filter characteristic possessing steeper attenuation properties, e.g. such as that of a Chebyshev filter, because in the noise filter characteristic between input and output, the zero points of the closed loop can be moved from the DC point to any position on the unit circle of the Z plane.

Moreover, it is preferable that a filter order switching control portion is connected so as to control the operation of the first to fourth switching circuits and the characteristics of the first integrator, including the filter order, can be made variable by selectively switching the timing of operation and the paths of the charge-holding circuits being used based on control signals obtained from the filter order switching control portion.

Because this configuration permits changing integrator filter characteristics by selectively switching the first and second feedback circuits being used, even when the required input signal frequency band and SNR characteristics are switched, optimum SNR characteristics can be obtained by switching the filter order of the integrators.

Moreover, even when the period of the sampling time interval is varied, the first and second feedback circuits can be selectively switched such that the filter characteristics of the integrators will not change, and, as a result, the same input signal frequency band can be ensured regardless of the variation in the sampling time interval.

Moreover, the clocks controlling the sampling time intervals based on the first to fourth switching circuits can be formed using multiple clocks with different clock duty ratios. Generally speaking, in a Delta-Sigma AD converter with an n-th order filter configuration, noise degradation due to settling characteristic degradation is reduced with each subsequent integrator by the noise-shaping effect and requirements related to integrator output settling accuracy can be relaxed. Based on the above-described configuration, even with the same control clock interval, the SNR characteristics can be improved by adjusting the magnitude of the sampling time interval such that the sampling time interval is made longer using control directed at the operation of the integrator on the preceding-stage side and the sampling time interval is made shorter using control directed at the operation of the integrator on the subsequent-stage side.

Moreover, a configuration may be used, in which the clocks with different clock duty ratios are generated by means of frequency division from a single base clock. In accordance with this configuration, the SNR characteristics can be improved because jitter and other noise produced by the base clock is cut in half each time the frequency is halved.

Moreover, a configuration may be used, in which electric current supplied to the first integrator is switched in synchronism with the sampling timing. In accordance with this configuration, integrator current consumption can be reduced using control directed at the operation of the integrator on the subsequent-stage side, which can relax integrator output settling accuracy requirements, and, as a result, the current consumption of the Delta-Sigma AD converter can be reduced without degrading the SNR characteristics.

Embodiments of the present invention are described below with reference to drawings.

EMBODIMENT 1

Figure 1:
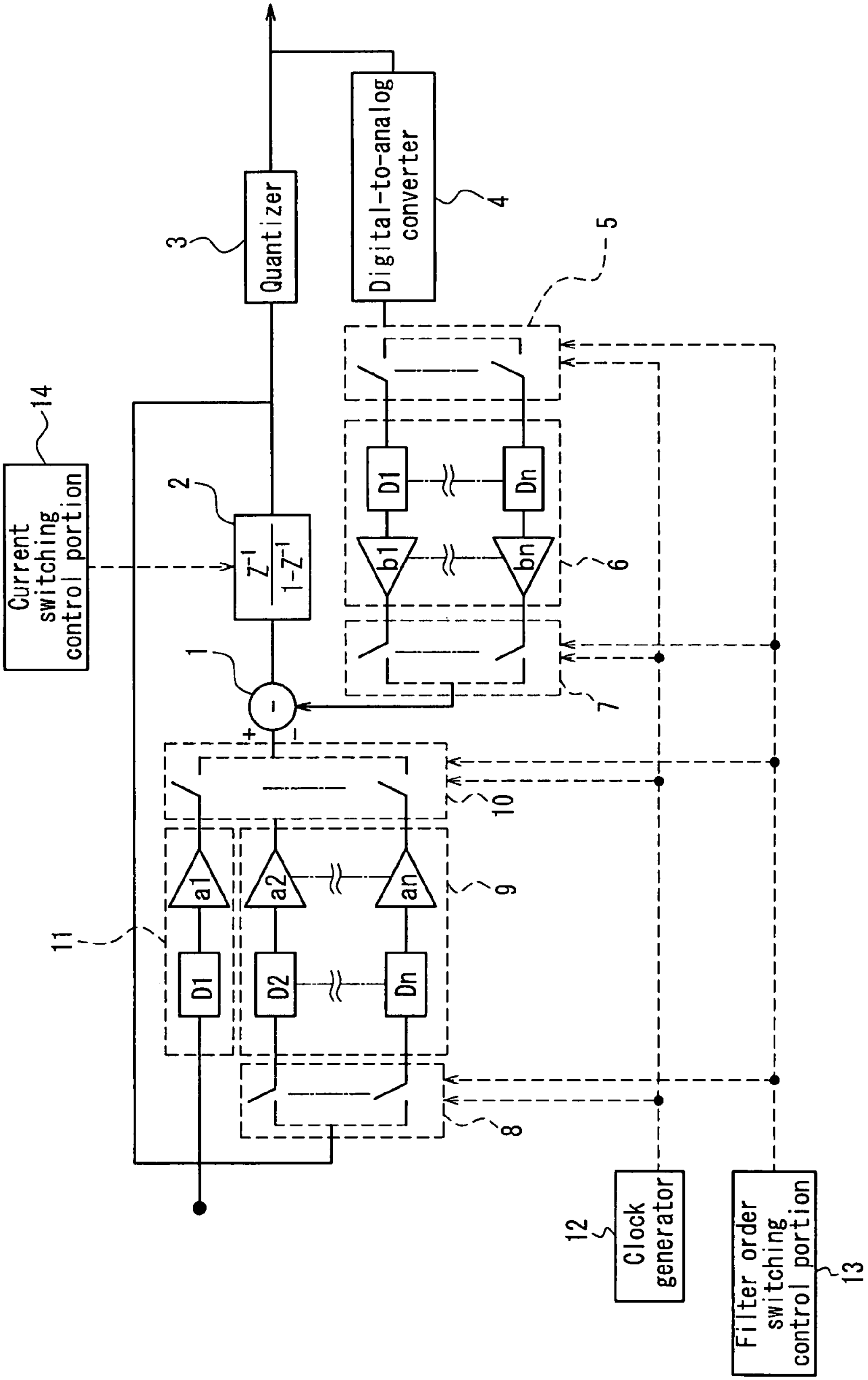
FIG. 1 a block diagram illustrating the configuration of a Delta-Sigma AD converter in Embodiment 1 of the present invention.

FIG. 1 shows a block diagram of a Delta-Sigma AD converter according to Embodiment 1 of the present invention. This Delta-Sigma AD converter is formed of a subtractor 1, a first integrator 2, a quantizer 3, a digital-to-analog converter 4, switching circuits 5, 7, 8 and 10, a first and second feedback circuits 6 and 9, and an input circuit 11.

The first feedback circuit 6 is formed of multiple charge-holding circuits (D1, b1)-(Dn, bn), with these charge-holding circuits switched by the switching circuits 5 and 7 and selectively connected between the first integrator 2 and the subtractor 1. The second feedback circuit 9 is formed of multiple charge-holding circuits (D2, b2)-(Dn, an), with these charge-holding circuits, along with a charge-holding circuit (D1, a1) constituting the input circuit 11, switched by the switching circuits 8 and 10 and selectively connected between the digital-to-analog converter 4 and subtractor 1.

The operation of the switching circuits 5, 7, 8 and 10 is carried out in accordance with clock signals supplied by a clock generator 12. Moreover, the switching circuits 5, 7, 8 and 10 can be switched by selecting the paths and timing of operation of the charge-holding circuits of the first and the second feedback circuits 6, 9 based on control signals obtained from a filter order switching control portion 13.

Furthermore, as described below, a current switching control portion 14 is provided for switching the electric current supplied to the first integrator 2.

This embodiment describes an example, in which the converter is a discrete sampling type Delta-Sigma AD converter and the input circuit 11, as well as the first and second feedback circuits 6, 9, are formed of switched-capacitor circuits.

Figure 2:
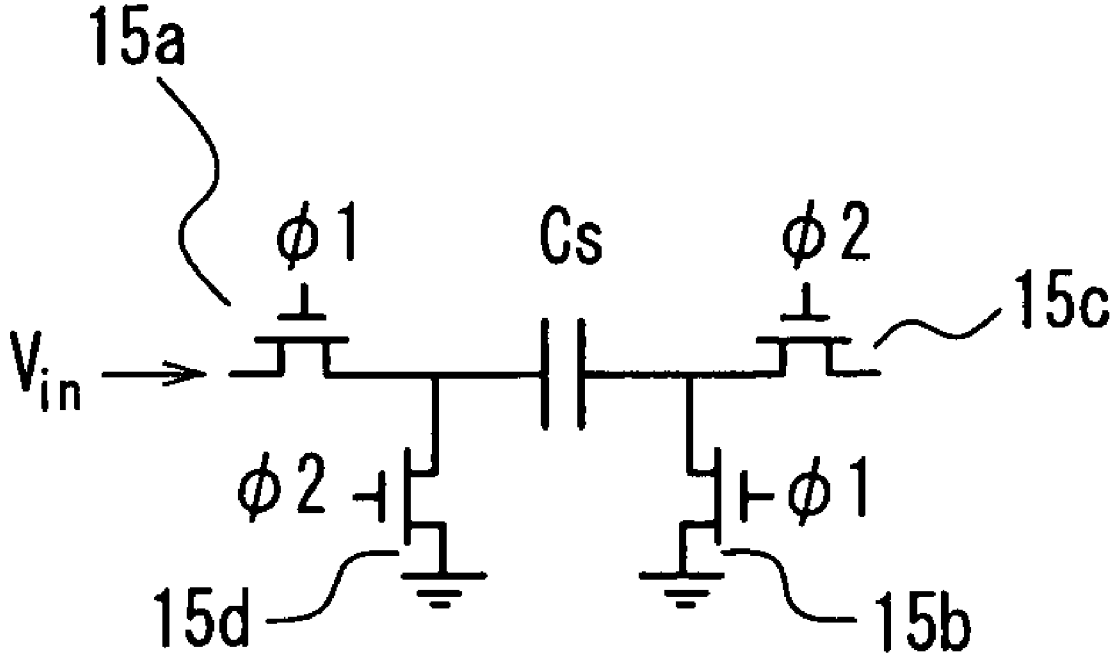
FIG. 2 is a circuit diagram illustrating an exemplary switched-capacitor circuit used in the same Delta-Sigma AD converter.

In other words, the input circuit 11, as well as the first and second feedback circuits 6, 9, can be formed, for instance, from switched-capacitor circuits comprising, as shown in FIG. 2, a capacitor Cs with a capacitance of Cs and four MOS switches 15*a*-15*d*. Its operation is as follows.

First of all, when an input signal, i.e. a voltage with an amplitude of Vin, is sampled, the MOS switches 15*a* and 15*b*, which are controlled in accordance with switch timing $\phi$1, are turned ON and the MOS switches 15*c* and 15*d*, which are controlled in accordance with switch timing $\phi$2, are turned OFF As a result, the input signal Vin is charged onto capacitor Cs as electrical charge Qs=Cs×Vin, in other words, as electrical charge whose value is equal to the capacitance Cs times the input signal Vin. Subsequent to the sampling time interval, the electrical charge continues to be stored by switching OFF the MOS switches 15*a*-15*d*, which are controlled in accordance with switch timings $\phi$1 and $\phi$2. By keeping OFF the MOS switches 15*a*,15*b* controlled in accordance with switch timing $\phi$1, and switching ON the MOS switches 15*c*,15*d* controlled in accordance with switch timing $\phi$2, the stored electrical charge is output as electrical charge Qs to a load connected to the output terminal.

In the first and second feedback circuits 6 and 9, even with the same input signal Vin, it becomes possible to output different amounts of charge by connecting two or more switched-capacitor circuits of the above-described configuration in parallel, and, for instance, varying the respective capacities of the switched capacitors.

Moreover, the switching circuits 5, 7, 8 and 10 can be configured, for example, by connecting two or more switches formed of MOS transistors in parallel and turning the respective switches ON.

The operation of the Delta-Sigma AD converter of the above-described configuration is described below. In the sampling time interval used in this embodiment, the clock timing configuration can be, for example, such as the one shown in FIG. 3. With respect to each of the clocks (clock high interval=T/2) used in cases where the integration is not multiplexed, in the clock timing configuration of FIG. 3, n clocks are used by dividing each of the sampling clocks by n (clock high interval=T/2n), which have respective intervals that do not go high simultaneously. Operation based on such clock timing will be explained below.

Figure 3:
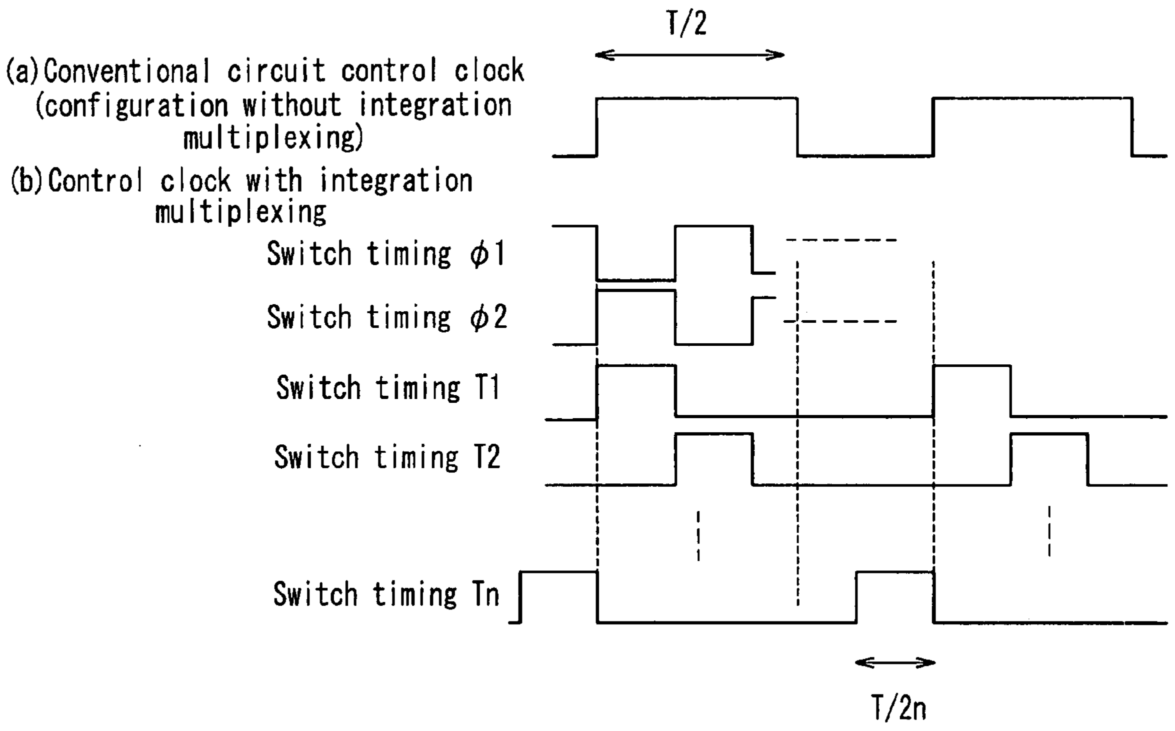
FIG. 3 is a diagram illustrating an example of switch timing of a clock used for controlling the same Delta-Sigma AD converter.

In accordance with a switch timing T1 of FIG. 3, an input signal is input to the input circuit 11 and the results of sampling are stored in the switched capacitor (D1, a1). In the first feedback circuit 6, the output results of the digital-to-analog converter 4, upon passing through the switching circuit 5, are sampled and stored in the first switched capacitor (D1, b1).

Next, in accordance with a switch timing T2, the electrical charges stored in accordance with switch timing T1 are subjected, upon passing through the switching circuits 7 and 10, to arithmetic processing in the subtractor 1 and the difference of the two input signals is output to the first integrator 2.

Here, signals input to the subtractor 1 are electrical charges, and because signal lines in a semiconductor IC commonly have a differential input circuit configuration, the subtracter 1 can be implemented using a simplified circuit configuration, in which a difference of two input electrical charges is output simply by cross-connecting and combining the differential outputs of the switching circuits 7 and 10.

The output voltage results integrated accumulatively in the first integrator 2, upon passing through the switching circuit 8, are sampled and stored in the first switched capacitor (D2, a2) of the second feedback circuit 9. The output voltage accumulated and stored in the first integrator 2 is also converted to a digital signal in the quantizer 3.

The digital output of the quantizer 3 is converted to an analog voltage by the digital-to-analog converter 4, passes through the switching circuit 5, and is sampled and held in the second switched capacitor (D2, b2) of the first feedback circuit 6.

Subsequently, operation associated with switch timings T3~Tn consists in repeating the above-described operations. In other words, the next-stage switched capacitor is utilized, in synchronism with the switch timing, as the switched capacitors used in the first and second feedback circuits 6 and 9.

As described above, in accordance with a switch timing Tn, accumulation and integration have been performed n times, which makes it possible to obtain the same digital output results as when the integrator is formed of an n-th order filter.

Moreover, when the first and second feedback circuits 6, 9 have a switched-capacitor configuration, the feedback circuits and switching circuits can be simplified. Specific examples will be explained with reference to FIG. 4.

Figure 4A:
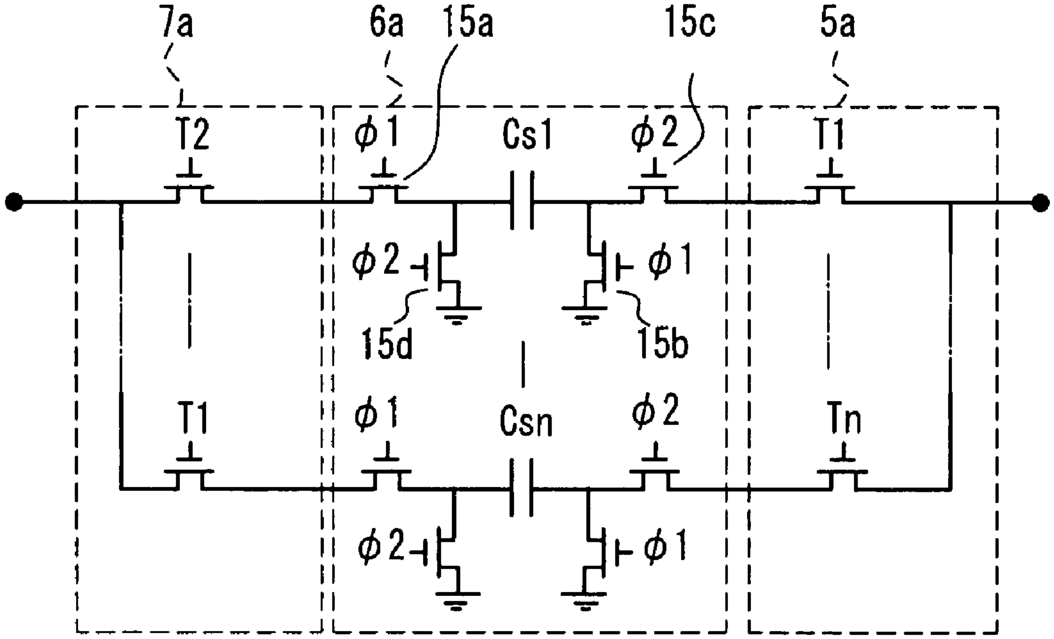
FIG. 4A is a circuit diagram illustrating an example of a switching circuit and feedback circuit used in the same Delta-Sigma AD converter.

FIG. 4A illustrates a configuration, in which the switched capacitor shown in FIG. 2 is utilized in the first feedback circuit 6*a*, which is connected to switching circuits 5*a*, 7*a* formed of MOS switches 16, 17. In this configuration, when the MOS switches 15*a*-15*d* are turned ON in accordance with the clock timing illustrated in FIG. 3, storage of electrical charge on the multiple switch capacitors Cs1-Csn arranged in parallel takes place only in the switched capacitor, in which switch timing $\phi$2 of the feedback circuit 6*a* and switch timings T1-Tn of the switching circuit 5*a* coincide. Similarly, discharge of electrical charge from the capacitors Cs1-Csn takes place only in the switch capacitors, in which switch timing $\phi$1 of the feedback circuit 6*a* and switch timings T1-Tn of the switching circuit 7*a* coincide.

Figure 4B:
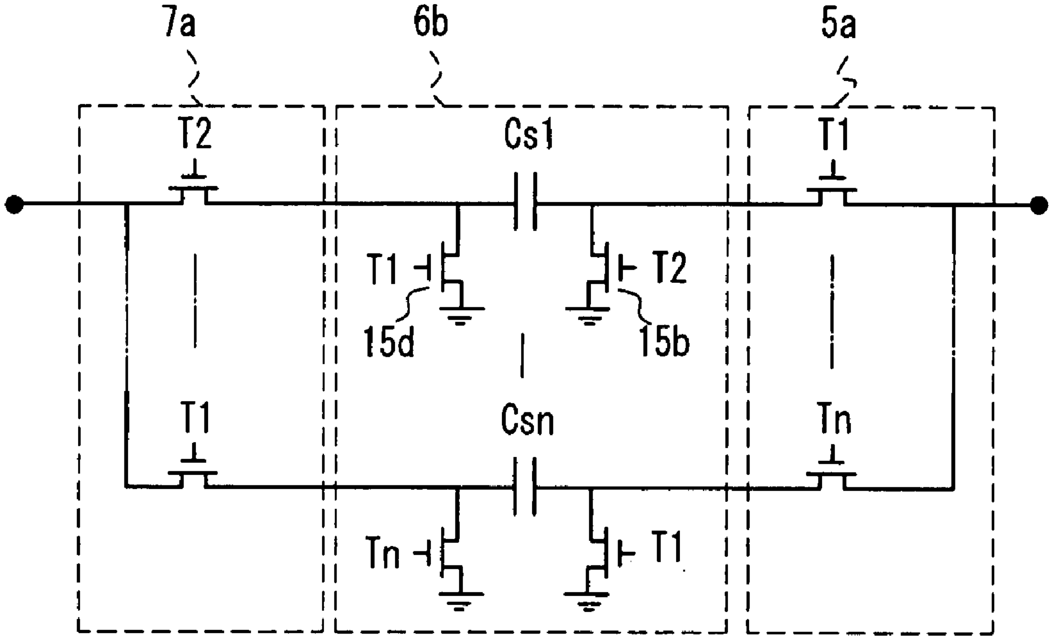
FIG. 4B is a circuit diagram illustrating another example of a switching circuit and feedback circuit used in the same Delta-Sigma AD converter.

On the other hand, because switch timings $\phi$1 and $\phi$2 are switched simultaneously with switch timings T1-Tn, the feedback circuit 6*a* of FIG. 4A can be revised, for instance, into the feedback circuit 6*b* illustrated in FIG. 4B. Namely, the MOS switches (15*a*, 15*c*, etc.), which are connected, respectively, between the switching circuits 5*a*, 7*a* and the capacitors Cs1-Csn in the feedback circuit 6*a*, can be omitted and the circuit can be simplified.

The switching operations performed by the switching circuits 5, 7, 8 and 10 as described above can be performed by selecting the operating timing and paths of the charge-holding circuits being used based on control signals obtained from the filter order switching control portion 13. This makes it possible to change the characteristics of the first integrator, including the filter order.

EMBODIMENT 2

Figure 5:
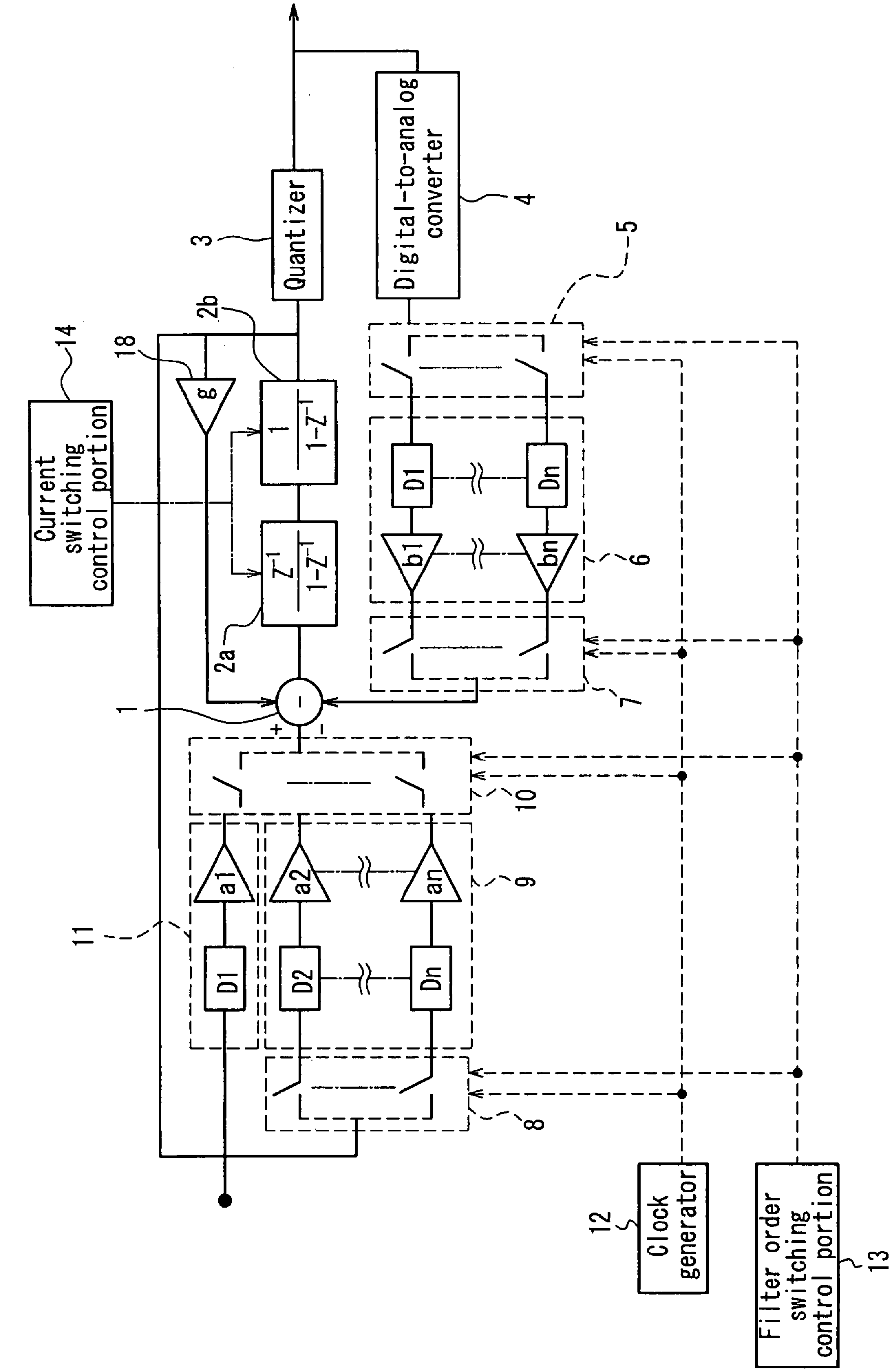
FIG. 5 a block diagram illustrating the configuration of a Delta-Sigma AD converter in Embodiment 2 of the present invention.

FIG. 5 shows a block diagram of a Delta-Sigma AD converter in Embodiment 2 of the present invention. In FIG. 5, elements identical to those of FIG. 1 are assigned the same reference numerals and the corresponding explanations are not repeated.

This Delta-Sigma AD converter is different from Embodiment 1 in that the first integrator, which integrates the output of the subtractor 1, is formed of two integrators 2*a*, 2*b* and a single feedback circuit 18.

Figure 6A:
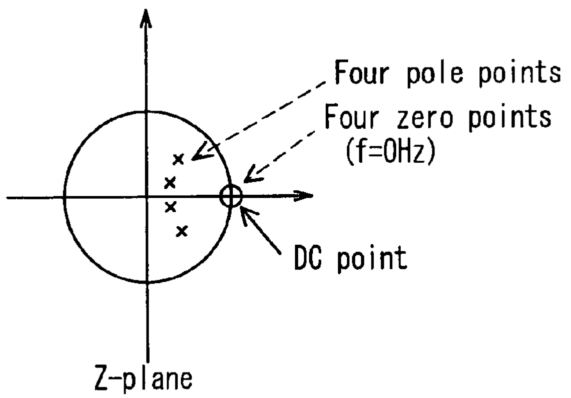
FIG. 6Aa is a diagram obtained by plotting the quantization noise filter characteristic of the Delta-Sigma AD converter of Embodiment 1 in the Z-plane.
Figure 6A:
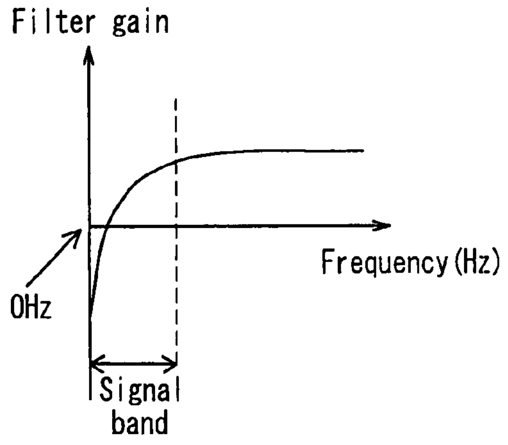

The quantization noise filter characteristic of this configuration will be explained with reference to FIGS. 6Aa, 6Ab, 6Ba, and 6Bb. FIGS. 6Aa, 6Ab, 6Ba, and 6Bb illustrate a noise filter characteristic obtained when a fourth-order noise filter is formed. FIGS. 6Aa and 6Ab describe the Delta-Sigma AD converter in Embodiment 1 and FIGS. 6Ba and 6Bb a Delta-Sigma AD converter utilizing a resonant circuit structure used in Embodiment 2.

As shown in FIG. 6Aa, in case of Embodiment 1, when the noise filter characteristic is plotted in the Z-plane, all four zero points of the noise filter transfer function are generated at the DC point (f=0 Hz). For this reason, as shown by the frequency characteristic of FIG. 6Ab, the noise filter characteristic exhibits a large amount of attenuation at f=0 Hz and if the necessary signal band is broadened, the amount of filter attenuation on the high frequency side is degraded.

Figure 6B:
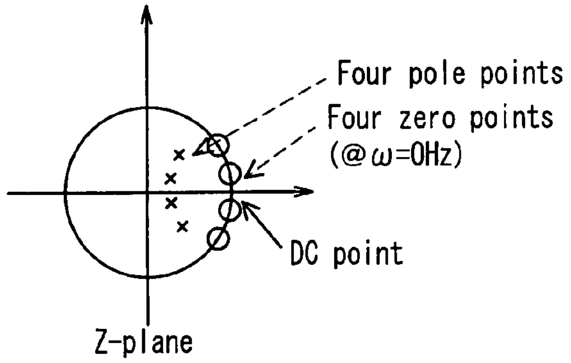
FIG. 6Ba is a diagram obtained by plotting the quantization noise filter characteristic of the Delta-Sigma AD converter of Embodiment 2 in the Z-plane.
Figure 6B:
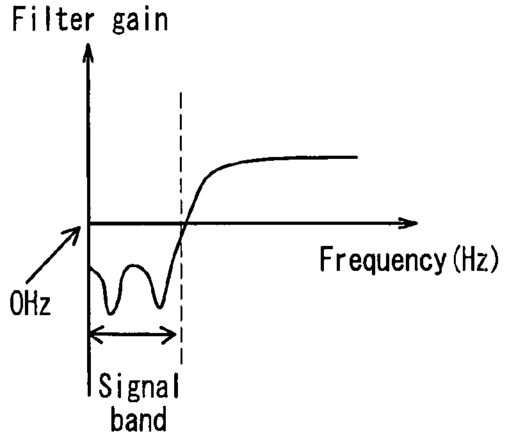

On the other hand, in case of Embodiment 2, a resonant circuit structure is utilized, in which the signals of the output terminals of two integrators 2*a*, 2*b* return to the input terminals via the feedback circuit 18. For this reason, as shown in FIG. 6Ba, the Z-plane zero points of the noise filter can be moved away from the DC point to any position on the unit circle in the Z-plane. For this reason, in the frequency characteristic shown in FIG. 6Bb, the amount of zero point-induced attenuation can be set at any position. As a result, a filter characteristic possessing steeper attenuation properties, e.g. such as that of a Chebyshev filter, can be obtained within the necessary signal band.

For this reason, quantization noise within the signal band can be further attenuated even if the formed Delta-Sigma AD converter is of the same filter order as in Embodiment 1.

EMBODIMENT 3

Figure 7:
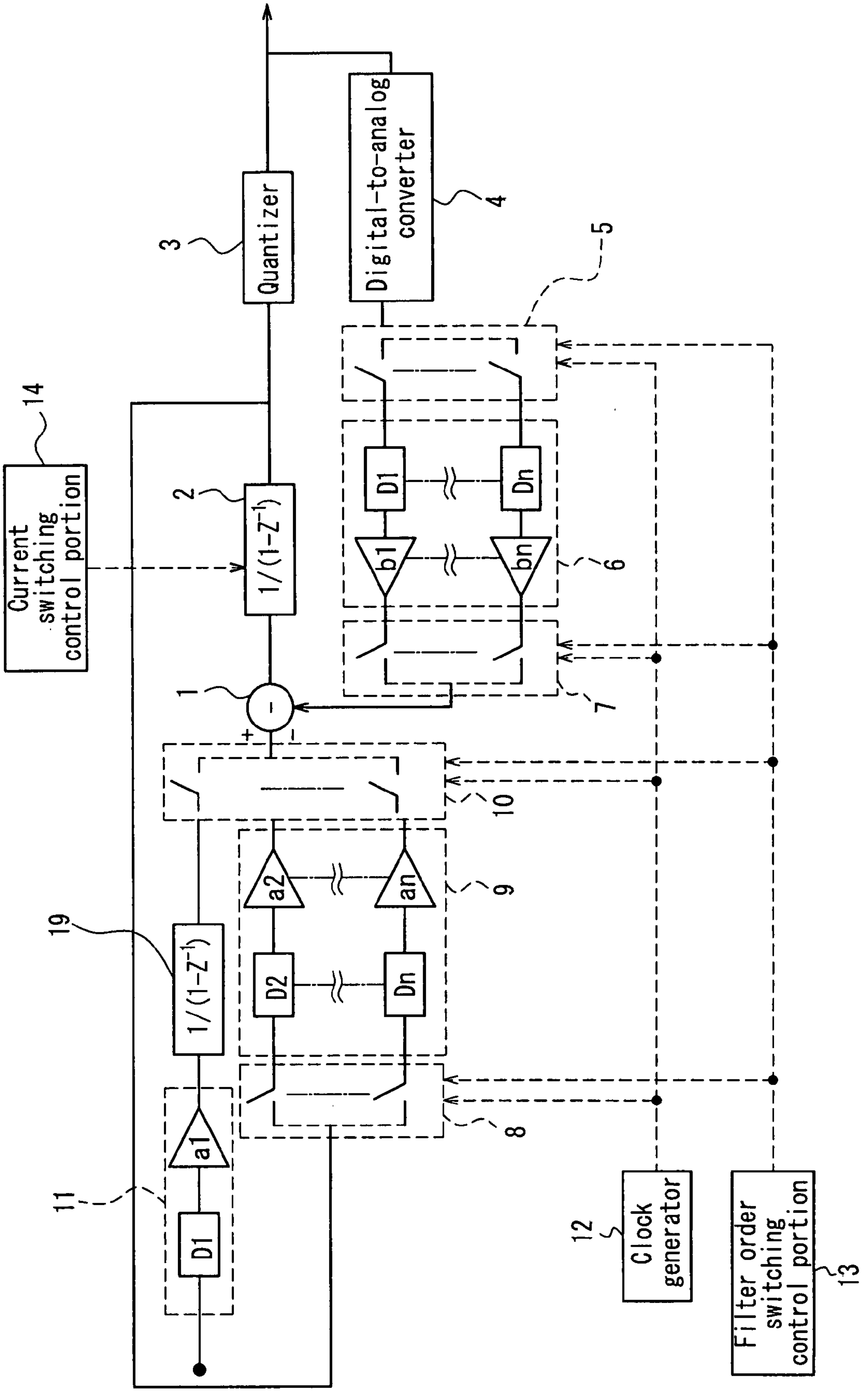
FIG. 7 is a block diagram illustrating the configuration of a Delta-Sigma AD converter in Embodiment 3 of the present invention.

FIG. 7 shows a block diagram of a Delta-Sigma AD converter in Embodiment 3 of the present invention. In FIG. 7, elements identical to those of FIG. 1 are assigned the same reference numerals and the corresponding explanations are not repeated.

This Delta-Sigma AD converter differs from Embodiment 1 in that a second integrator 19 is provided between the input circuit 11 and switching circuit 10.

Generally speaking, when a high n-th order filter characteristic is configured in order to obtain high SNR characteristics, there is no noise-shaping effect in the initial integrator, to which the input signal is input. By contrast, the current consumption has to be increased for the purpose of suppressing settling time and the integrator-generated internal noise and, at the same time, considerable gain switching has to be done to limit I/O gain in order to ensure the stability of the closed loop characteristics.

On the other hand, referring to the clock timing shown in FIG. 3, in Embodiment 1, in accordance with the switch timing T1 which is used to integrate the output of the input circuit 11, a high SNR can be obtained based on a high n-th order filter characteristic by switching the current consumption and gain of the first integrator 2 by the current switching control portion 14 illustrated in FIG. 1.

However, in the configuration of Embodiment 1, additional control is provided to switch the current consumption and gain of the first integrator 2 for each switch timing and ensuring the stability of the closed loop characteristics of the Delta-Sigma AD converter becomes difficult.

By contrast, in Embodiment 3, where the second integrator 19, which integrates the input signal, is provided separately from the first integrator 2, there is no need for controlling the switching of the current consumption and gain in the second integrator 19 because the current consumption and gain of the second integrator 19 are adjusted in advance. As a result, a high SNR can be obtained based on a high n-th order filter characteristic ensuring the stability of the closed loop characteristics of the Delta-Sigma AD converter.

Furthermore, Embodiment 3 makes more efficient use of the fact that time is required for switching the I/O gain and current consumption of the integrators during each sampling time interval when using double-sampling, which involves operating the circuitry during each half-period of the sampling time interval and operating the integrators in a continuous manner. As a result, degradation in integrator characteristics, such as settling time, etc., can be reduced.

Figure 8:
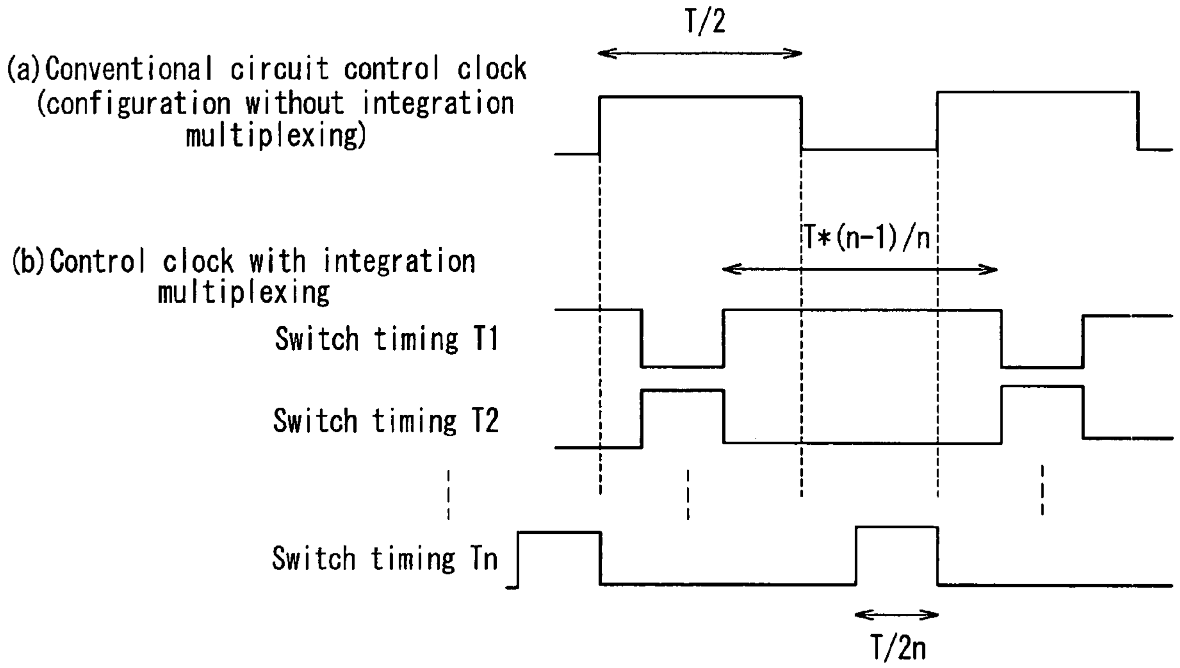
FIG. 8 is a diagram illustrating an example of switch timing of a clock used for controlling the same Delta-Sigma AD converter.

Moreover, the timing that controls the Delta-Sigma AD converter may be set such that, as shown e.g. in FIG. 8, only switch timing T1, which is used for integrating the output of the input circuit 11, is rendered different from other switch timings.

In accordance with the control timing of FIG. 8, the second integrator 19 can integrate the output results of the input circuit 11 using the time of switch timing T1 in addition to the time when the results of integration are output to the subtractor 1 via the switch circuit 10 in accordance with switch timing T2. For this reason, settling time required for integration can be increased to the time of $T/2n\times(n-1)$. Moreover, it is evident that, based on the structure of this embodiment, the settling time of switch timing T1 can be adjusted to an arbitrary time of up to $\times(n-1)$.

Generally speaking, insufficient settling of the initial-stage integrator with an n-th order filter characteristic is the primary factor in SNR degradation due to insufficient settling time. Accordingly, the lack of settling time can be remedied and SNR degradation can be reduced by making the sampling interval longer in the initial-stage integrator.

Moreover, the current consumption of the second integrator 19 can be reduced because it is possible to make the settling time longer without incurring SNR degradation.

Figure 9:
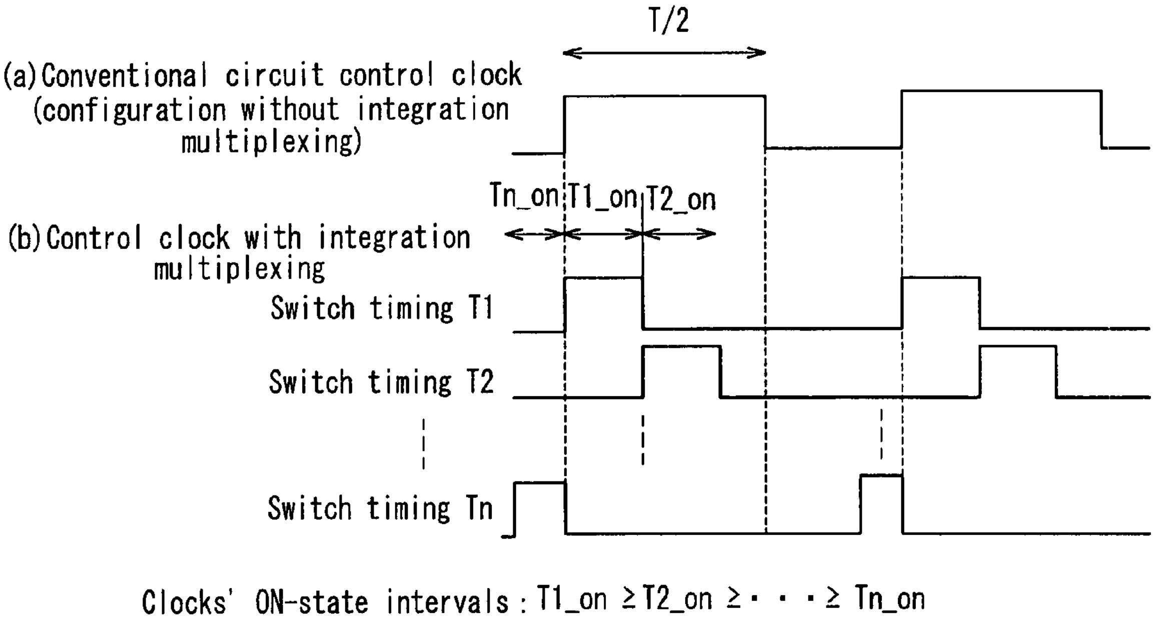
FIG. 9 is a diagram illustrating an example of switch timing of a clock applicable to the Delta-Sigma AD converters used in the embodiments of the present invention.

It should be noted that, in the configurations of the above-described Embodiments 1-3, the sampling clocks controlling the switching circuits 5, 7, 8 and 10 based on the switch timings can be configured as shown in FIG. 9. Namely, various kinds of sampling clocks having sampling intervals with different clock duty ratios, such as the ones shown in FIG. 9, are generated by the clock generator 12.

Figure 10:
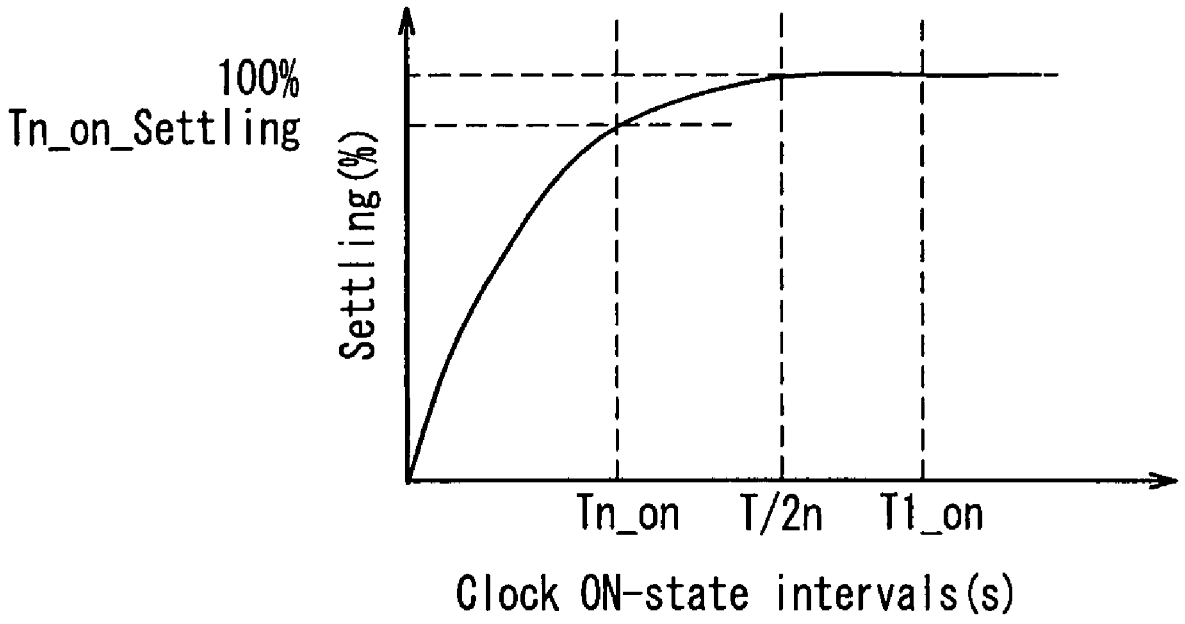
FIG. 10 is a diagram illustrating an example of settling timing in the same Delta-Sigma AD converter.

As shown in FIG. 10, the settling waveforms of the switch timings are represented by waveforms exponentially increasing in proportion to time elapsed since the start of settling. For this reason, the longer the ON-state intervals of the switches are, the greater the improvement in the accuracy of settling. Accordingly, adjustments can be carried out in such a manner that, for example, the clocks' ON-state intervals are made progressively shorter for clock timings T1-Tn and, in accordance with the switch timing T1, the accuracy of settling is improved by making the clock's ON-state interval longer in comparison with time T/2n obtained by equally dividing the clock timing while in accordance with the switch timing Tn, the accuracy of settling is allowed to degrade by making the clock's ON-state interval shorter. Namely, if the ON-state intervals of clock timings T1-Tn are designated, respectively, as T1_on~Tn_on, then T1_on≧T2_on ≧ . . . ≧Tn_on.

On the other hand, generally speaking, in a Delta-Sigma AD converter with an n-th order filter configuration, noise degradation due to settling characteristic degradation is reduced by the noise-shaping effect with each subsequent integrator. For this reason, even if the accuracy of settling is degraded, the ON-state intervals of the switch timings can be set such that the SNR characteristics will not be affected.

Accordingly, when a clock configuration such as the one in FIG. 9 is used, an improvement in the settling accuracy of the integration operation of the preceding stage, which has no noise-shaping effect, can be achieved and the SNR can be further improved in comparison with the clock configuration of FIG. 3 by exercising control directed at the operation of the preceding-stage integrator to make the clock's ON-state interval longer than T/2n (T1_on>T/2n).

Figure 11:
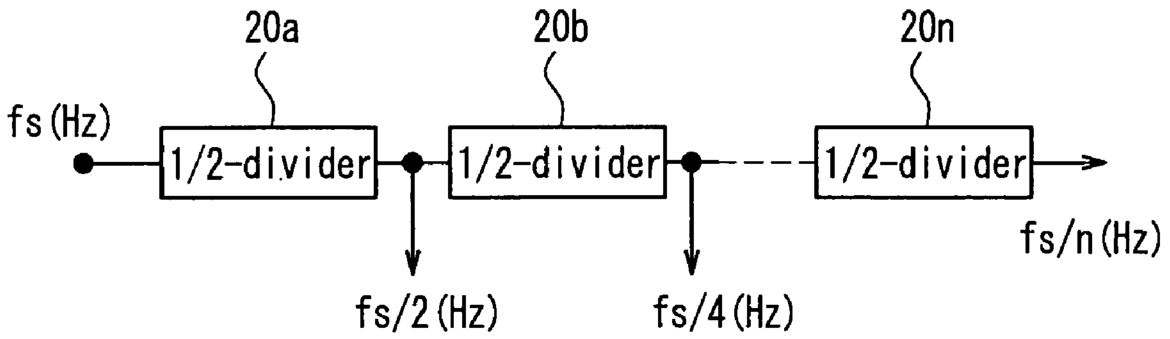
FIG. 11 is a diagram illustrating an example of a unit generating multiple clocks in the same Delta-Sigma AD converter.

Moreover, when configuring switch timings such as the ones in FIG. 3 or FIG. 9, a configuration can be used, in which clocks are generated by means of frequency division from a single base clock. An example of a unit generating multiple clocks by subjecting a base clock (fs) to frequency division is provided in FIG. 11. In FIG. 11, a base clock is input to multiple ½ -dividers 20*a*, 20*b*, . . . 20*n* connected in series and, whenever it goes through one of the ½ -dividers 20*a*, 20*b*, . . . 20*n*, the frequency is divided in two and the resultant clock is outputted.

In accordance with this configuration, jitter noise-induced degradation of the SNR characteristic can be further reduced because jitter and other noise produced due to the base clock is cut in half each time the frequency is halved.

Figure 12:
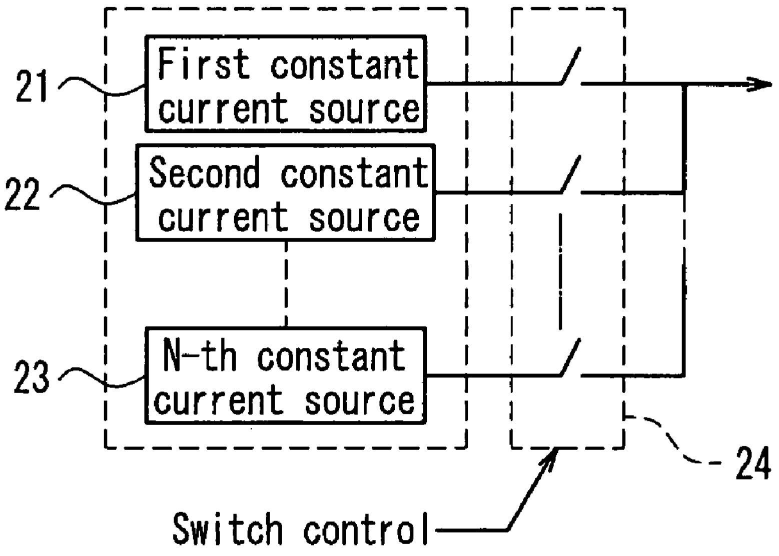
FIG. 12 is a diagram illustrating an exemplary configuration of a current switching control portion in the same Delta-Sigma AD converter.
Figure 13:
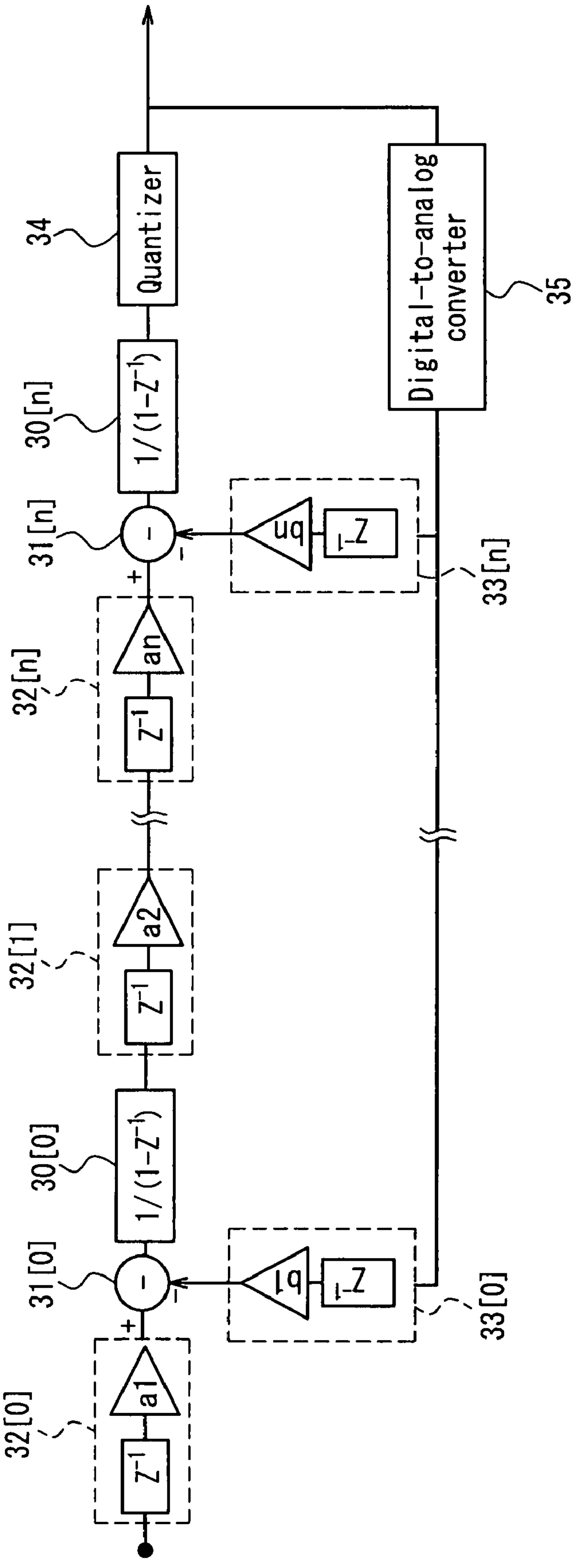
FIG. 13 a block diagram illustrating the configuration of a conventional Delta-Sigma AD converter.
Figure 14:
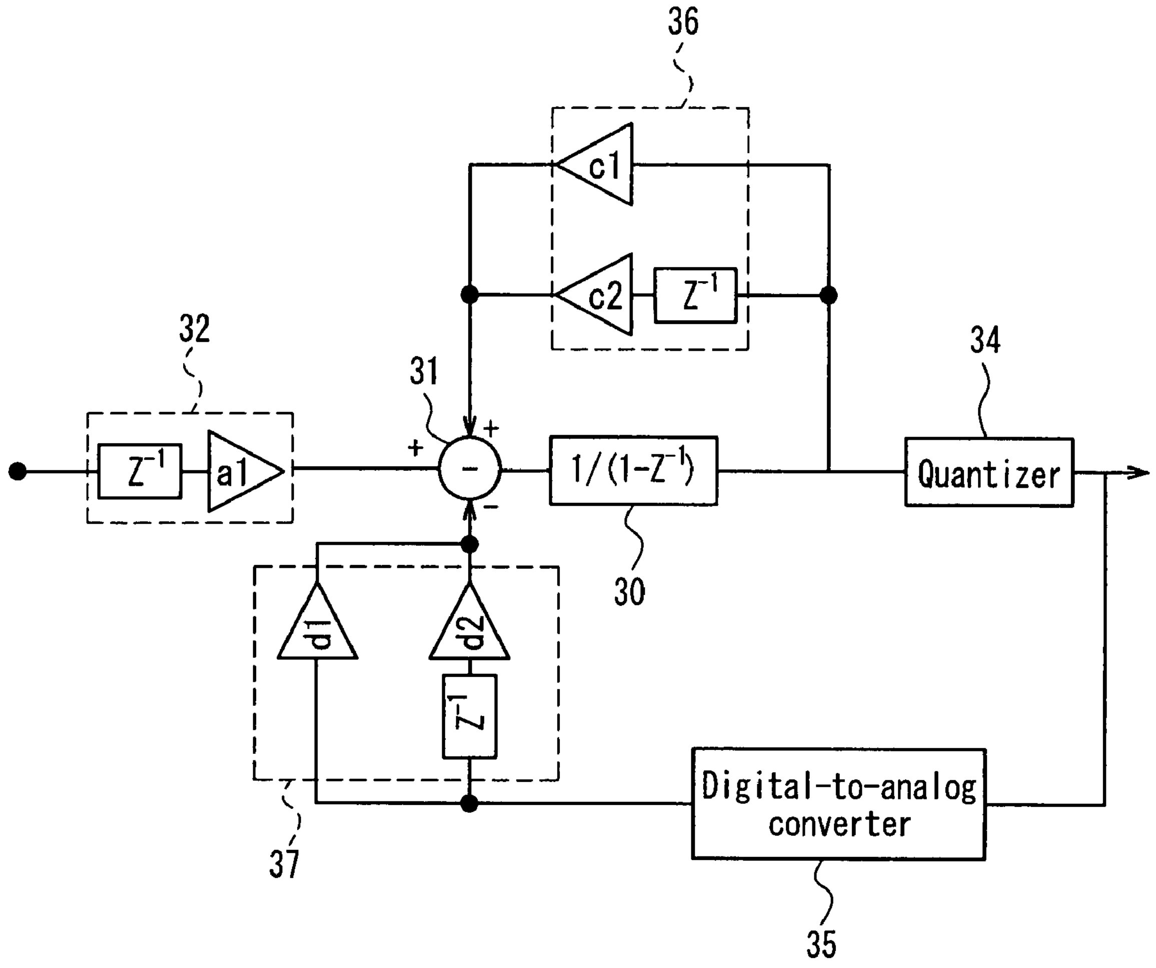
FIG. 14 a block diagram illustrating the configuration of another conventional Delta-Sigma AD converter.

Moreover, a configuration may be used, in which electric current supplied to the integrators is switched for each of the multiple clock timings by the current switching control portion 14. An exemplary configuration used in the current switching control portion 14 is illustrated in FIG. 12. As shown in FIG. 12, the electric current supplied to the integrators can be easily configured with the help of first-nth constant current sources 21~23, which supply predetermined electric currents, and a switching circuit 24, which switches the current sources by means of switch control and provides output.

In general, the settling accuracy of an integrator is degraded in proportion to the decrease in the operating current consumption. By contrast, in accordance with the above-described configuration, in a delta-sigma AD converter with an n-th order filter configuration, noise degradation due to settling characteristic degradation is reduced by the noise-shaping effect with each subsequent integrator. For this reason, it is possible to make adjustments such that integrator current consumption is improved while avoiding degradation of the SNR characteristics.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A Delta-Sigma AD converter comprising:

a subtractor outputting a difference of two analog input signals;

a first integrator integrating the output of the subtractor;

a quantizer quantizing the output signal of the first integrator;

a digital-to-analog converter outputting an analog signal in proportion to the output signal of the quantizer;

a first switching circuit that, for each predetermined sampling timing, switches the output signal of the digital-to-analog converter and successively outputs the output signal to different output paths;

a first feedback circuit having a plurality of charge-holding circuits respectively connected to different output paths from the first switching circuit, with the charge-holding circuits holding respectively differing amounts of feedback of a signal in proportion to the magnitude of the output signal of the digital-to-analog converter during predetermined sampling time intervals;

a second switching circuit that, for each sampling timing, switches the signal held in the first feedback circuit and outputs the signal to one of the input terminals of the subtractor, an input portion that, for each predetermined sampling timing, holds a signal in proportion to the analog input signal during a fixed sampling time interval;

a third switching circuit that, for each predetermined sampling timing, switches the output signal of the first integrator and successively outputs the output signal to different output paths;

a second feedback circuit having a plurality of charge-holding circuits respectively connected to different output paths from the third switching circuit, with the charge-holding circuits holding differing amounts of feedback of a signal in proportion to the magnitude of the output signal of the first integrator input from the third switching circuit during predetermined sampling time intervals; and a fourth switching circuit that, for each sampling timing, switches a signal held in the input portion and a signal held in the second feedback circuit and inputs the signal to the other input terminal of the subtractor;

wherein the plurality of signals of different sampling timings held in the first and second feedback circuits are integrated accumulatively in the subtractor and first integrator.

2. The Delta-Sigma AD converter according to claim 1 comprising a second integrator that is inserted between the input portion and the fourth switching circuit, integrates signals held in the input portion, and inputs the signals to the input terminal of the fourth switching circuit.

3. The Delta-Sigma AD converter according to claim 2, wherein the input portion and second integrator are controlled using a sampling timing configured with a clock duty ratio different from the predetermined sampling time intervals in the first and second feedback circuits.

4. The delta-sigma AD converter according to claim 1, wherein the first and second feedback circuits are formed of switched capacitors.

5. The delta-sigma AD converter according to claim 1, wherein the first integrator is formed of two integrators and one feedback circuit.

6. The delta-sigma AD converter according to claim 1, comprising a filter order switching control portion connected so as to control the operation of the first to fourth switching circuits, wherein the characteristics of the first integrator, including the filter order, can be made variable by selectively switching the timing of operation and the paths of the charge-holding circuits being used based on control signals from the filter order switching control portion.

7. The delta-sigma AD converter according to claim 1, wherein the clocks controlling the sampling time intervals based on the first to fourth switching circuits are formed using a plurality of various clocks with different clock duty ratios.

8. The delta-sigma AD converter according to claim 7, wherein the clocks with different clock duty ratios are generated by frequency division from a single base clock.

9. The delta-sigma AD converter according to claim 7, wherein electric current supplied to the first integrator is switched in synchronism with the sampling timing.

* * * * *